United States Patent [19]
Michon et al.

[11] Patent Number: 5,187,380
[45] Date of Patent: Feb. 16, 1993

[54] LOW CAPACITANCE X-RAY RADIATION DETECTOR

[75] Inventors: Gerald J. Michon, Waterford; Dale M. Brown, Schenectady; Marvin Garfinkel, Niskayuna; Dominic A. Cusano, Schenectady, all of N.Y.

[73] Assignee: General Electric Company, Schenectady, N.Y.

[21] Appl. No.: 865,515

[22] Filed: Apr. 9, 1992

[51] Int. Cl.$^5$ .......................... H01L 27/14; G01T 1/24
[52] U.S. Cl. ..................................... 257/428; 257/459; 257/620; 257/654; 250/370.09; 250/370.11; 250/370.14
[58] Field of Search ...................... 357/29, 30 D, 30 F, 357/30 G, 20; 250/370.08, 370.09, 370.11, 370.14

[56] References Cited

U.S. PATENT DOCUMENTS

| | | | |
|---|---|---|---|
| 4,140,909 | 2/1979 | Brown et al. | 357/29 |
| 4,146,904 | 3/1979 | Baertsch et al. | 357/30 |
| 4,152,595 | 5/1979 | Garfinkel et al. | 250/370.01 |
| 4,160,985 | 7/1979 | Kamins et al. | 357/30 |

Primary Examiner—Andrew J. James
Assistant Examiner—Ngan Van Ngo
Attorney, Agent, or Firm—Marvin Snyder

[57] ABSTRACT

A low capacitance radiation detector comprises a monocrystalline silicon substrate heavily doped to N type conductivity with a more lightly doped N type conductivity epitaxial layer formed on the substrate. A plurality of heavily doped N type upper surface layer segments are formed in the epitaxial layer. A patterned region of the epitaxial layer, heavily doped to P type conductivity and in the shape of parallel stripes joined at each end by a respective stripe perpendicular to the parallel stripes, is formed in the epitaxial layer and situated between adjacent ones of the upper surface layer segments, with each stripe extending into the epitaxial layer deeper than, and separated from, the upper surface layer segments so as to form a minority charge carrier-collecting PN junction with the epitaxial layer. The parallel stripes are spaced apart from each other by a distance smaller than or comparable to the minority charge carrier recombination diffusion length for the epitaxial layer, and the epitaxial layer thickness is smaller than or comparable to the minority charge carrier recombination diffusion length. In a second embodiment, the epitaxial layer has beveled edges and the heavily doped N type upper surface layer segments formed in the epitaxial layer extend over the beveled edges.

24 Claims, 4 Drawing Sheets

LOW CAPACITANCE X-RAY RADIATION DETECTOR

BACKGROUND OF THE INVENTION

This invention relates to radiation detecting devices and, more particularly, to low capacitance diode detectors for converting optical radiation into electrical signals.

This invention is an improvement over the invention described and claimed in Baertsch et al. U.S. Pat. No. 4,146,904 issued Mar. 27, 1979 and assigned to the present assignee.

In computerized tomography systems, X-ray radiation detectors are employed to produce electronic signals in response to impingment of X-rays thereon. From these signals, viewable images of internal portions of a subject through which the X-rays pass can be constructed. To create these signals, the X-ray detectors in computerized tomography systems employ scintillators to convert the X-ray radiation into light that can be detected by photodetectors from which the electronic signals are produced. A scintillator, however, imposes limits on how fast the detector can operate and, in order to exceed these limits, scintillators of low efficiency in converting X-rays into optical radiation have been employed. Such scintillators produce lower output light intensity for any given level of X-ray intensity than comparable scintillators of higher efficiency.

In order to obtain benefit of the high speed but reduced output light intensity of a low efficiency scintillator in an X-ray radiation detector, a more sensitive photodetector than normally used for a high efficiency scintillator must be employed. This, in turn, requires that the photodetector have a high signal-to-noise ratio. The present invention is therefore directed to an x-ray radiation detector employing a photodetector of high sensitivity to optical radiation.

Semiconductor diode detectors are used in various radiation sensing applications. Spurious signals, known as "noise", however, tend to degrade the information sensed by such detector. The primary constituents of the noise in systems employing such detectors are amplifier noise, which is a function of detector capacitance, and dark current shot noise. Reduced noise levels lead directly to sensitivity improvements which are highly desirable in many applications.

A low capacitance semiconductor diode can be constructed by minimizing the junction area and employing doping gradients to prevent minority charge carriers from reaching the front surface (i.e., radiation-receiving surface) where they can be lost through surface recombination, and by using either a thin wafer with a back surface doping gradient, or an epitaxial layer on a heavily doped substrate to prevent the minority charge carriers from being lost through back surface recombination or from diffusing deep into the semiconductor where they can be lost through bulk recombination. A primary requirement is that the minority charge carrier recombination diffusion length be long or at least comparable to the junction collector spacing and active layer thickness.

Reduction in junction area also leads to reduction in the volume of depleted semiconductor, which in turn leads to reduced dark current or, in the case of operation at zero bias, an increase in diode shunt resistance. Diode thermal noise is reduced in either case.

The state-of-the-art in detector diodes is the PIN detector diode, a P type/Intrinsic layer/N type structure in which diode capacitance is determined by the thickness and purity of the intrinsic layer. The diode of the present invention is constructed with doping levels similar to those of the PIN detector diode, but with the junction area reduced to reduce both capacitance and dark current. Collection efficiency is maintained by using doping gradients to prevent the generated charge from reaching surface and bulk recombination regions, thereby increasing the probability of collection by the reduced area junction.

SUMMARY OF THE INVENTION

Briefly, in accordance with a preferred embodiment of the invention, a low capacitance radiation detector comprises a monocrystalline silicon substrate doped to one type conductivity, such as N type. A first semiconductor layer is epitaxially grown on the substrate and doped to the one type conductivity although more lightly than the substrate. A plurality of upper surface layer segments of the first semiconductor layer are doped to the one type conductivity more heavily than the remainder of the first semiconductor layer. A patterned region of the first semiconductor layer is heavily doped to a conductivity type opposite the one type conductivity (i.e., P type) and takes the shape of substantially parallel stripes extending further than the upper surface layer segments into the remainder of the first semiconductor layer so as to form a minority charge carrier-collecting PN junction. The patterned region of the first semiconductor layer is situated between, but separated from, the upper surface layer segments. The first semiconductor layer exhibits a predetermined minority charge carrier recombination diffusion length, and the stripes of the patterned region are spaced apart from each other by a distance smaller than or comparable to the minority charge carrier recombination diffusion length. The thickness of the first semiconductor layer is also smaller than, or comparable to, the minority charge carrier diffusion length. The edges of the first layer may, in one embodiment, be beveled so as to minimize escape of light therefrom.

DETAILED DESCRIPTION OF THE PREFERRED EMBODIMENTS

Figure 1:
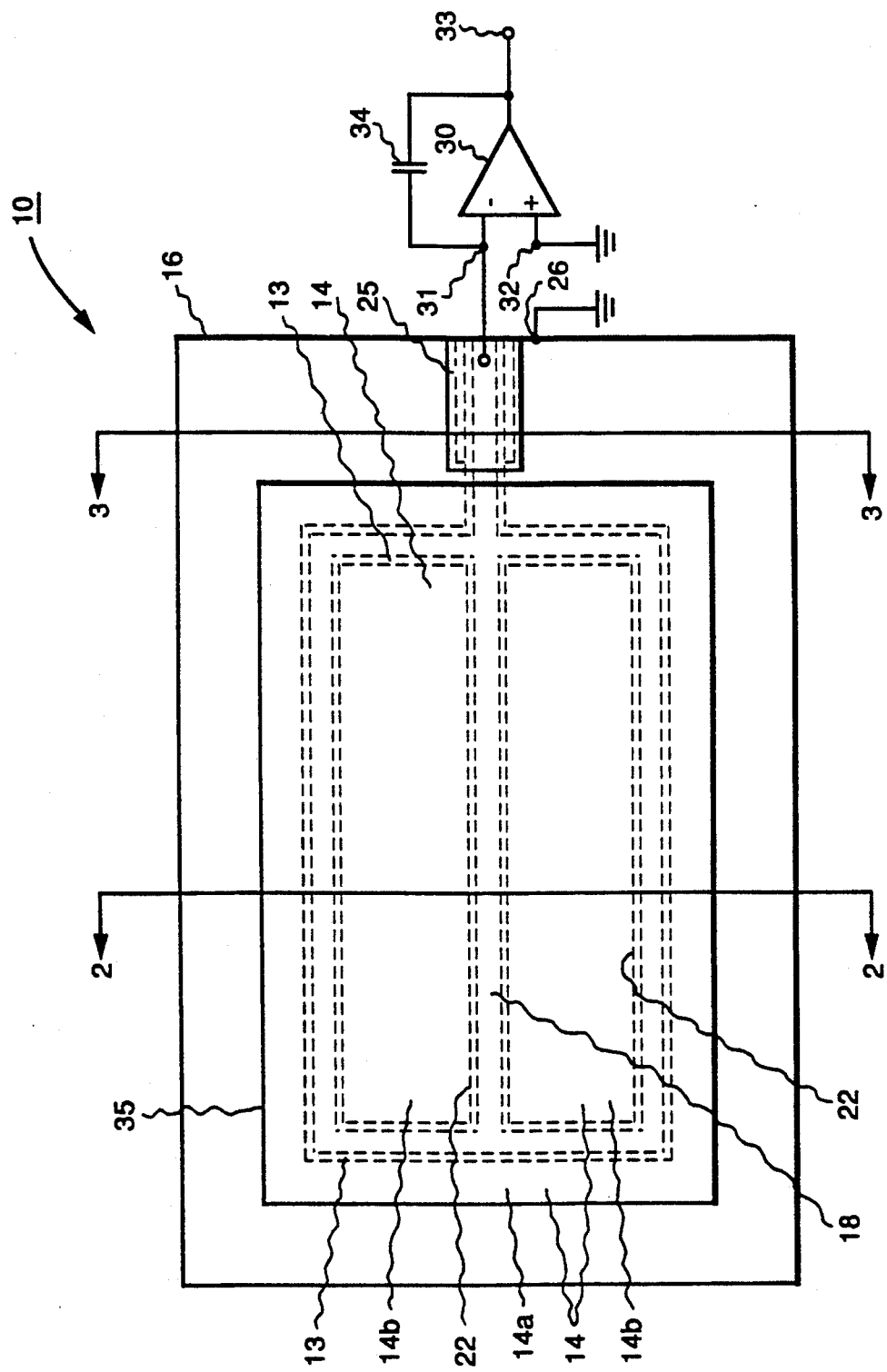
FIG. 1 is a plan view of an x-ray radiation detector configured in accordance with the present invention.
Figure 2:
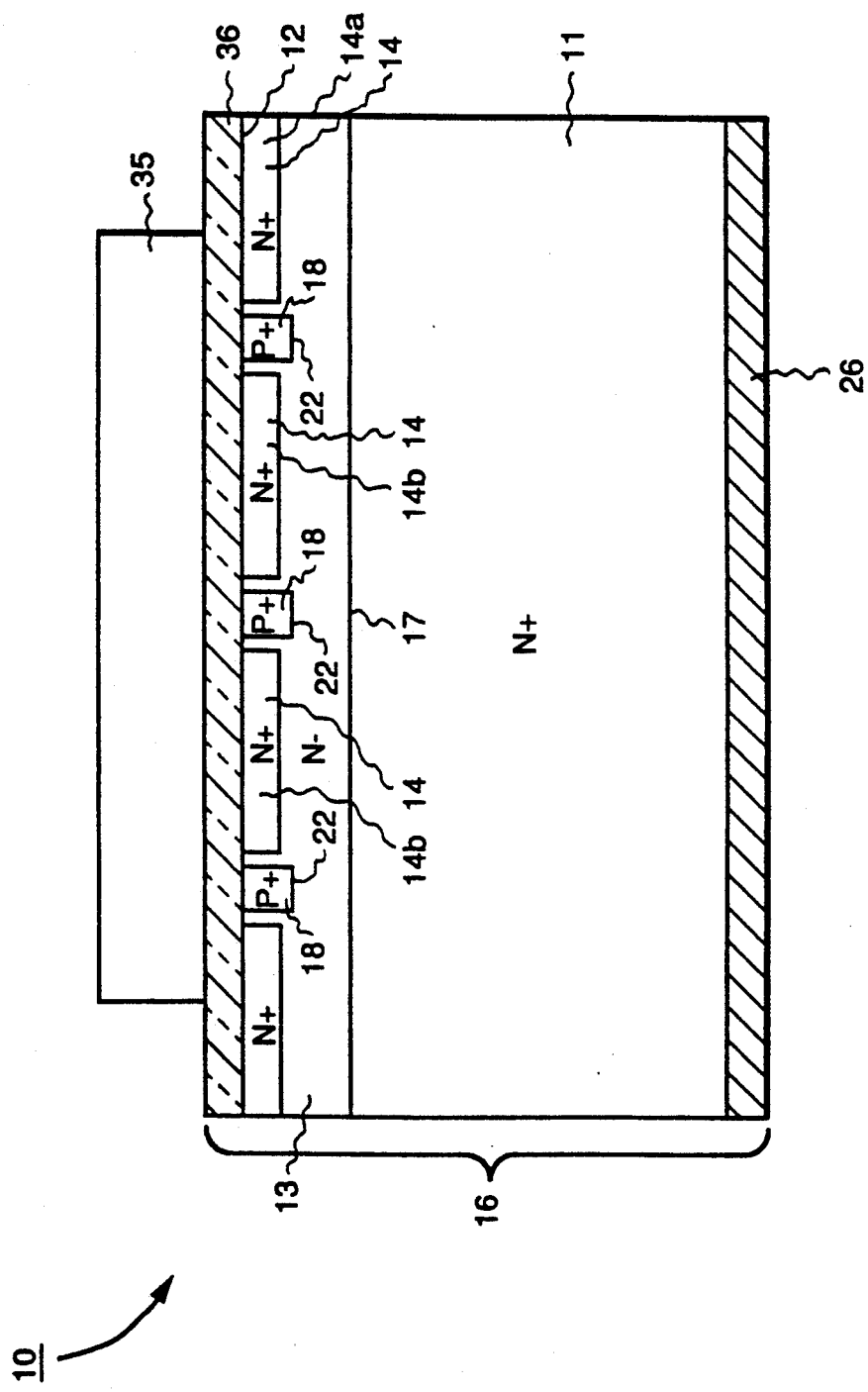
FIG. 2 is a sectional view of the x-ray detector of FIG. 1 taken along section line 2—2, showing detail of the internal construction thereof.
Figure 3:
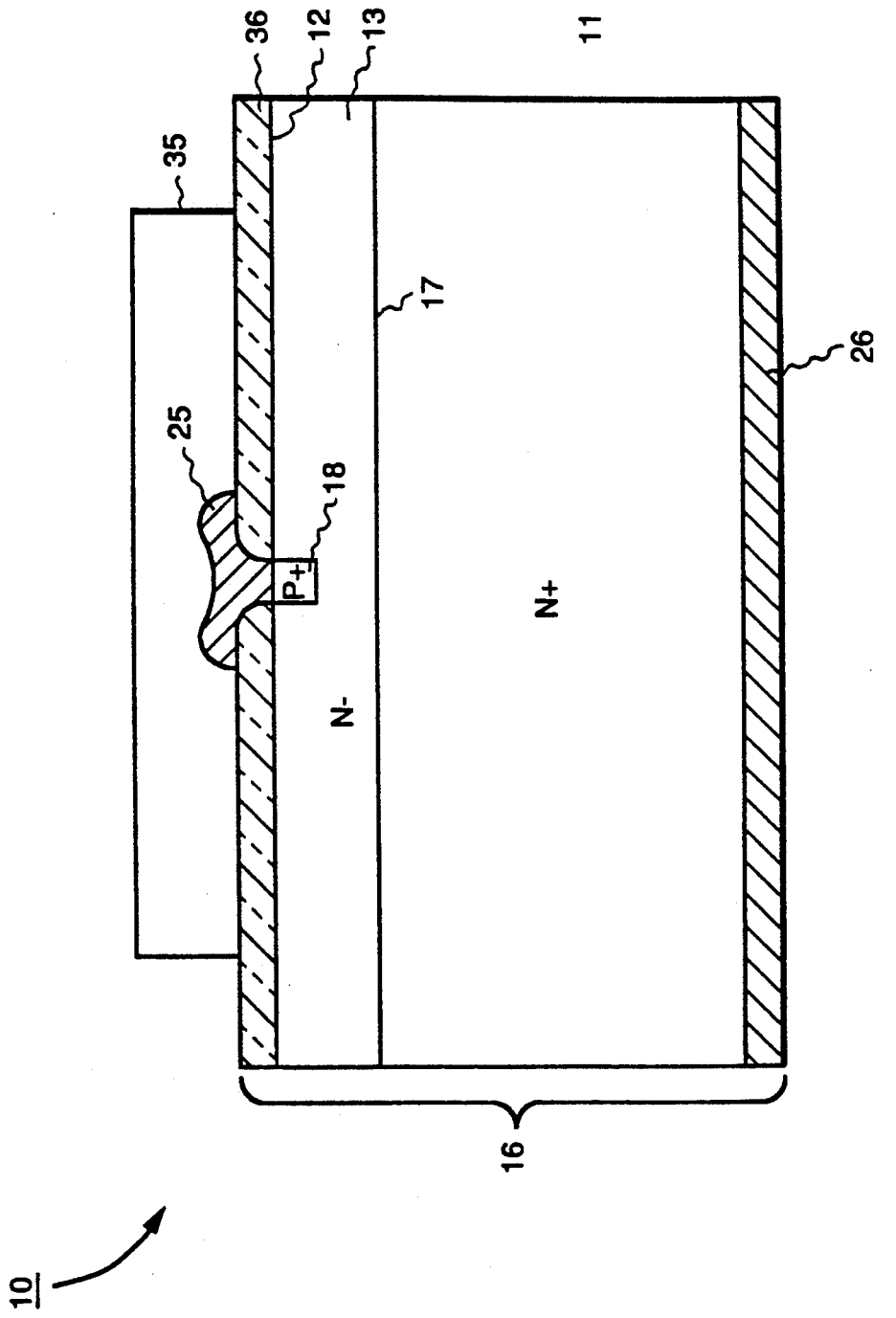
FIG. 3 is another sectional view of the X-ray detector of FIG. 1 taken along section line 3—3, showing further detail of the internal construction thereof.

FIGS. 1, 2 and 3 illustrate an X-ray radiation detector 10 including a substrate 11 of monocrystalline semiconductor material, preferably silicon, heavily doped to N type conductivity (designated N+). A lightly doped N type region 13 (designated N−) is epitaxially grown on substrate 11 to form a buried doping gradient 17. A region 14 heavily doped to N type conductivity (designated N+) and comprised of separate segments 14b surrounded by an outer segment 14a according to the pattern shown in the plan view of FIG. 1 is diffused, or preferably ion implanted, into the upper surface 12 of epitaxial layer 13. Surface 12 constitutes the front surface of the photodiode portion of detector 10. A heavily doped P type conductivity region 18 (designated P+) is formed in layer 13 to create a PN junction 22. Region 18, which may be formed by diffusion, or preferably by ion implantation, is situated in the portion of layer 13 between adjacent N+ segments 14a and 14b so as to take the shape evident in the plan view of FIG. 1 and leave a predetermined gap between itself and N+ segments 14a and 14b. Surface layer 14 also provides a surface doping gradient at its N−/N+ interfaces.

Because layer 14 is patterned to include two parallel segments 14b, for example, P+ region 18 is in the form of parallel stripes, here three, joined by a connecting portion at each end thereof. Thus each of N+ segments 14b is completely surrounded by P+ region 18, which extends beyond (i.e., deeper than) layer 14 from front surface 12 into layer 13.

P+ region 18 forms a PN junction 22 with N− region 13 and has longitudinal edges closely spaced to adjacent edges of N+ segments 14a and 14b. The lateral surface area of each of N+ segments 14a and 14b is substantially greater than the lateral surface area of P+ region 18, as evident in the plan view of FIG. 1. An anode terminal 25 (shown in FIGS. 1 and 3) provides conductive connection to P+ region 18 and a cathode terminal 26 secured to the bottom surface of N+ region 11 provides conductive connection to the substrate. A thin layer 36 of insulation, such as silicon dioxide, and transparent to optical radiation, is applied over the major surface 12 of N− layer 13, completing a photodiode 16.

Substrate 11 has a substantial thickness, for example, 18 mils, and a very low lifetime for minority charge carriers generated therein to result in a very short diffusion length. As low a lifetime as possible is desired in substrate 11 to minimize the number of minority charge carriers available at interface 17 between substrate 11 and N− layer 13 in response to absorption of stray high energy radiation, such as X-ray radiation, by the substrate. Minority charge carrier lifetime is preferably reduced by heavily doping this substrate with donor atoms. Considerable reduction in minority charge carrier lifetime is achieved by heavy doping with activators as is known in the art. See, for example, J. Krausse, "Auger Recombination", *Solid State Electronics*, 1974, Vol. 17, pp. 427–429. Such heavy doping reduces the equilibrium concentration of minority charge carriers therein and hence also reduces dark current generation in the substrate layer. Thus the low lifetime of minority charge carriers in substrate 11 is achieved by heavily doping substrate 11 with, for example, about $10^{19}$ antimony atoms per cubic centimeter, corresponding to a resistivity of about 0.01 ohm-cm.

N− layer 13 is substantially thinner than substrate 11 by at least an order of magnitude and, for example, may be in the range of 5 to 30 microns in thickness, such as 15 microns, sufficient to absorb a predetermined portion of the optical radiation desired to be detected. Layer 13 is provided with a minority charge carrier lifetime which is preferably as high as possible to provide a very long diffusion length for minority charge carriers generated therein in response to absorption of optical radiation, and hence to provide the detector with high sensitivity. Resistivity of N− layer 13 may be, for example, in the range of 50 to 1000 ohm-cm, with 1000 ohm-cm being preferable to provide a minority charge carrier lifetime of substantially 100 microseconds. The N− conductivity of layer 13 may be provided by a donor dopant, such as phosphorous, with the silicon grown epitaxially on N+ substrate 11 to the desired thickness. A doping level of about $10^{13}$ atoms per cc is preferred. The provision of N− layer 134 of substantially higher resistivity than N+ substrate 11 has the additional effect of channeling the flow of minority charge carriers generated in N− layer 13 along the N− layer to the collection region, i.e., P+ region 18, by inhibiting the flow of minority charge carriers into N+ substrate 11.

N+ regions 14a and 14b are substantially thinner than N− region 13 by at least an order of magnitude, being surface layer segments of thickness on the order of, for example, 0.3 microns and with a resistivity substantially lower than the resistivity of N− layer 13, for example, 0.05 ohm-cm. The lower resistivity of N+ regions 14a and 14b provides a built-in field or voltage gradient extending from these layers to substrate 11. This built-in voltage gradient inhibits movement of minority charge carriers from N+ layer 13 into surface layer segments 14a and 14b and hence this repulsion together with that produced by N+ substrate 11 constrains the minority charge carriers (holes, in the embodiment described) to move within N+ layer 13 to the collection region 18. Heavy doping of N+ segments 14a and 14b reduces the equilibrium concentration of minority charge carriers therein and hence reduces dark current produced thereby. Surface layer segments 14a and 14b may be produced by ion implantation using a donor, such as antimony, at a preferred doping level of about $5 \times 10^{18}$ atoms per cc, and are made sufficiently thin to pass a major portion of the optical radiation incident thereon. P+ anode region 18 may similarly be produced by ion implantation using an acceptor, such as boron, at a preferred doping level of about $2 \times 10^{19}$ atoms per cc, leaving a gap of from 10 to 30 microns, typically 30 microns, between region 18 and the adjacent surface layer segments 14a and 14b. The three parallel stripes of region 18 may extend for a length of 30 mm along centers that are 254 microns apart from each other.

FIG. 1 illustrates a circuit for operating detector device 10, and includes a high gain differential amplifier 30 having an inverting terminal 31, a noninverting terminal 32 and an output terminal 33. Noninverting terminal 32 is coupled to ground, as is substrate terminal 26. Inverting terminal 31 is coupled through terminal 25 to P+ region 18. A feedback capacitance 34 is coupled between output terminal 33 and inverting terminal 31. High gain differential amplifier 30 with capacitive feedback thus functions as a conventional integrator to integrate the output current of photodiode terminal 25 and provide noise reduction for the detector output signal.

As previously described, surface layer segments 14a and 14b of the same N conductivity type as layer 13, but of substantially lower resistivity, establish a built-in field or voltage gradient adjacent major surface 12 of N− layer 13 which repels minority charge carriers, while substrate 11, which is also of the same N conductivity type as layer 13, but of much lower resistivity, similarly establishes a built-in field which repels minority charge carriers in layer 13 away from substrate 11. Thus any minority carrier charge generated in N− layer 13 underlying N+ surface layer segments 14a and 14b as a result of incident radiation is confined to the path or channel constituted by layer 13. The minority charge carriers thus diffuse to P+ region 18 and are conducted to terminal 25. As terminals 31 and 32 are maintained at close to the same potential as a consequence of the action of amplifier 30, the generated charge flows through capacitance 34 to output terminal 33. Thus the potential on terminal 33 is proportional to the radiation-induced current flow through capacitance 34.

In utilizing the detector of the invention to detect radiation of a wavelength to which the semiconductor photodiode 16 is essentially transparent, such as, for example, X-rays, suitable conversion means for converting X-rays to wavelengths to which the semiconductor photodiode is responsive, such as wavelengths in the optical range, is provided. To this end, the detector of the invention includes a scintillator 35, suitable for converting high energy radiation or X-rays into light to which the semiconductor material is more responsive, optically coupled to major surface 12 of N− layer 13. Scintillator 35 is situated on insulation layer 36 and may be comprised of a material such as cesium iodide activated by thallium.

While using a detector, such as described herein, for detecting X-rays, a small amount of X-ray radiation that may be present in the environment in which the detector is utilized may impinge upon the semiconductor material of the photodiode. Even though the semiconductor material is essentially transparent to X-rays, some of that radiation is nevertheless absorbed by the semiconductor material, resulting in release of high energy electrons. Such high energy electrons produce, by a multiplying action, a relatively large number of minority charge carriers which constitute background noise and reduce considerably the sensitivity or signal-to-noise ratio of the detector. Such minority charge generation occurs over the entire semiconductor volume of photodiode 16. In accordance with the present invention, the effectiveness of photodiode 16 in supplying such generated charge due to high-energy background radiation is considerably reduced by employing, as a substantial portion of photodiode 16, semiconductor material of very low lifetime. This result is achieved by imbuing N+ substrate layer 11 with a low lifetime for minority charge carriers. Use of such structure in radiation detectors is particularly desirable when scintillators, which have low efficiency of conversion of X-rays into optical radiation, are used with the detectors. It is necessary, on occasion, to use such low conversion efficiency scintillators because of their other desirable characteristics, such as high speed of response. One such scintillator is bismuth germanate. With the improvement in signal-to-noise ratio provided by the photodiode of the present invention, practical use can be made of the unique characteristics of low efficiency scintillators. In the preferred embodiment, scintillator 35 typically emits optical electromagnetic radiation at a wavelength of 600 nanometers.

In addition to the advantages mentioned above, namely, immunity of the detector to background charge generation due to stray high energy radiation and low dark current generation occurring in the large semiconductor volume of N+ substrate 11 and in the thin N+ surface layer segments 14a and 14b, a low capacitance output results from separation of the charge generation and collection function and the charge sensing function. This feature is also present in Baertsch et al. U.S. Pat. No. 4,146,904, issued Mar. 27, 1979 and assigned to the instant assignee. The areas of segments 14a and 14b may be made very large in relation to the area of P+ region 18, for example, 100 times larger, to provide a relatively large total area from which charge is collected while the area of P+ region 18 itself is kept relatively small to provide low output capacitance and hence improved signal-to-noise ratio. Alternatively, if still smaller values of output capacitance are desired in order to further improve sensitivity of the detector, a reverse bias may be provided on PN junction 22 by appropriately biasing noninverting terminal 32 with respect to ground by a suitable bias voltage source.

In the detector of the present invention, minority charge carriers generated and collected in N− layer 13 underlying the thin N+ segments 14a and 14b move by diffusion to output region 18 where they may be stored or read out. The time of charge carrier travel from a point of generation in N− layer 13 to the output region is a function of the square of the distance between the point of generation and the output region. Thus the detector speed of response is limited by the diffusion of those minority charge carriers which are generated farthest from the output region 18 of P type conductivity. The speed of response is inverse to the square of the width of the portion of N− layer 13 underlying N+ segments 14a and 14b. The provision of elongated (in plan view) N+ surface layer segments 14a and 14b and region 18 of type conductivity surrounding segments 14a and 14b keeps to a minimum the distance that charge carriers must travel to reach P+ region 18, resulting in a high speed of response. This high speed of response is at the expense of some decrease in sensitivity due to the relatively large area of the output PN junction 22. A number of electrically-connected elongated regions of N type conductivity may be provided on a common epitaxial layer, with each elongated region having a pair of thin layers of low resistivity semiconductor material at either side thereof to enhance the speed of response. The number and spacing of such elongated regions is chosen so as to obtain the desired speed of response and, in the present invention, is chosen in accordance with the pattern of P+ region 18 illustrated in plan view in FIG. 1.

The detector of the present invention provides a substantial improvement in signal-to-noise ratio over that of the detector of the aforementioned Baertsch et al. U.S. Pat. No. 4,146,904. The improvement derives from the fact that the semiconductor volume of photodiode 16 in which background charge is generated by high-energy radiation is constituted of very low lifetime material and hence substantially minimizes the number of carriers of such charge that reach the charge collection region. Moreover, the low capacitance of the photodiode keeps amplifier noise to a minimum, the amplifier noise being substantially proportional to the sum of the photodiode capacitance plus amplifier feedback capacitance (i.e., capacitance 34) divided by the amplifier feedback capacitance. A typical value of capacitance for the photodiode of the present invention is 60 picofarads while capacitance 34 is typically 10 picofarads, so that the gain of the amplifier for its input referred noise is approximately 7.

A particularly advantageous organization of materials for the detector of the present invention comprises a substrate 11 of silicon of about 18 mils thickness, a resistivity of about 0.01 ohm-cm, and a minority carrier lifetime of about 0.04 microseconds. N− layer 13 is epitaxially grown on substrate 11 using a phosphorous dopant to provide a layer of about 15 microns thickness, a resistivity of about 1000 ohm-cm and a minority charge carrier lifetime of about 100 microseconds. N+ surface layer segments 14a and 14b, about 0.3 microns thick and with resistivity of about 0.05 ohm-cm are ion implanted into N− layer 13, and P+ region 18 is ion implanted into N− layer 13 to a depth of about 0.5 microns. The presence of N− layer 13 of about 15 microns in thickness provides for absorption of a major portion of incident radiation in the visible region of the optical spectrum. It is desirable to avoid making the thickness of layer 13, which constitutes the active region of photodiode 16, too large since substantially all of the incident optical radiation is absorbed in substantially the first 15 microns of layer 13 and any excessive thickness of layer 13 results in increased volume over which dark charge can be collected with a consequential degradation of performance. A passivating layer 36 of silicon dioxide 0.1 microns thick may be provided over surface 12 of N− layer 13.

Figure 4:
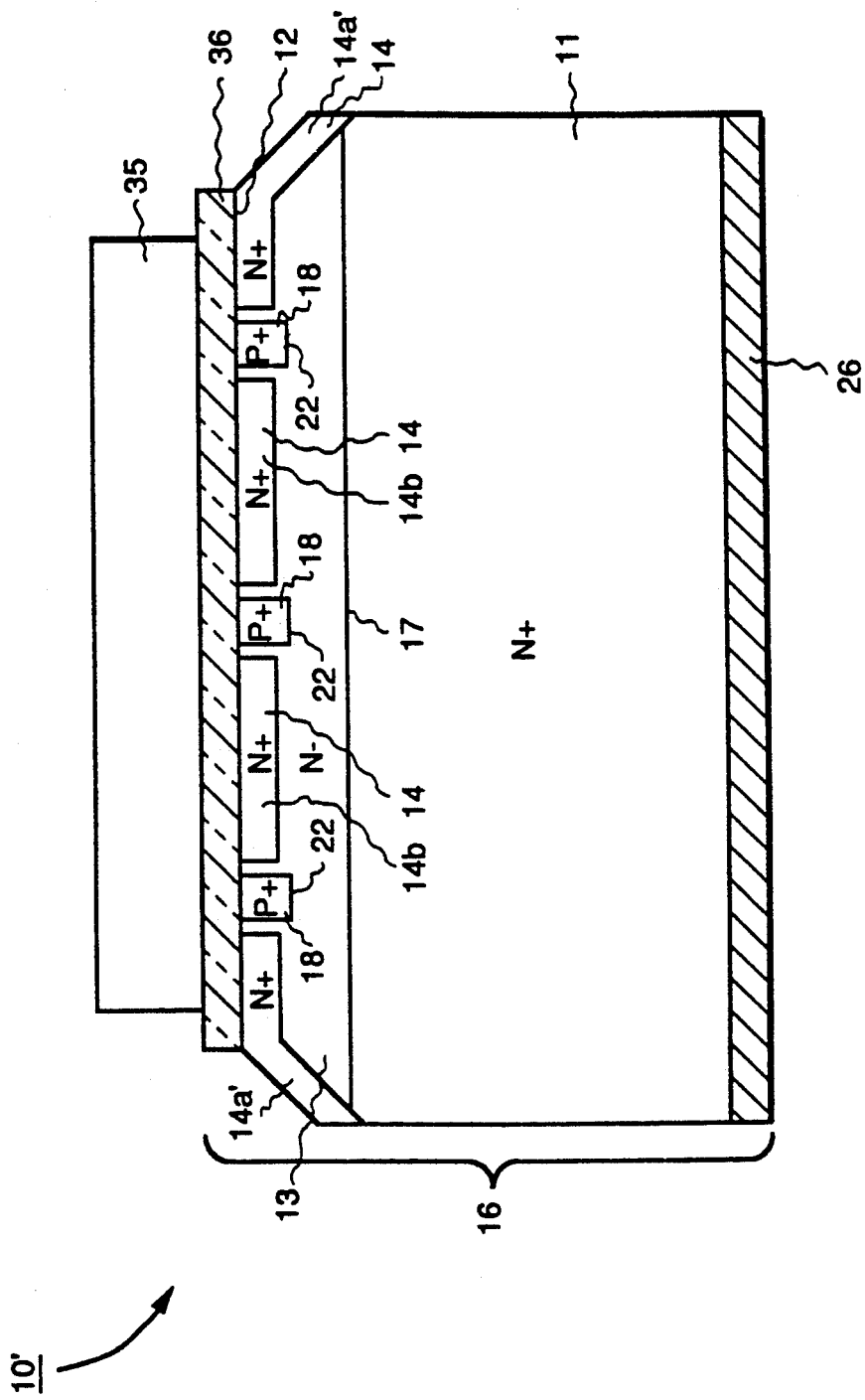
FIG. 4 is a sectional view of an X-ray detector similar to that shown in FIG. 1 and taken along section line 2—2, but where the upper edges of the device are beveled.

FIG. 4 represents a second embodiment 10' of the invention in which N− layer 13 that is epitaxially grown is beveled at each edge, preferably at an angle of about 45°. The beveled edges may be produced by use of a silicon etch after epitaxial layer 13 has been formed on the substrate. Layer 14 is produced in a manner similar to that of the previous embodiment, being divided into separate segments 14b surrounded by an outer segment 14a' in a manner similar to that of segments 14b and 14a, respectively, as shown in FIG. 1. Here, however, segment 14a extends over the entire beveled edges of layer 13. The N+/N− interface on the beveled edges of layer 13 acts as a charge reflector, due to the "built-in field" or voltage gradient at the interface. This reduces the amount of undetected charge in layer 13 by reflecting diffusing minority charge carriers inwardly, i.e. back into the layer, from the beveled edges of the layer, so that they can be collected at P+ region 18. As a result of this improvement in efficiency of charge collection, the signal produced by the detector of FIG. 4 is increased in strength in response to any given X-ray intensity, thus beneficially raising the signal-to-noise ratio of the device.

While a substrate 11 of 18 mils thickness provides a convenient thickness for fabrication, substrates thinner than 18 mils can, of course, be utilized in the detector. The limit on thinness of the substrate is governed by practical processing and fabricating considerations. As a practical matter, substrates thinner than about 100 microns would present difficulties in processing and fabrication.

While the invention has been described for photodiodes fabricated of silicon semiconductor material, the invention is fully applicable to devices fabricated of other semiconductor materials. Moreover, while the invention has been described as comprising a semiconductor substrate 11 of N type conductivity with a P type output region 18, it will be understood that a P type substrate with a P type epitaxial layer and a P type surface layer, and with an N type output region 18, could be used in the alternative. Additionally, while P+ region 18 has been described for operation with zero bias, it will be understood that P+ region 18 may be operated with reverse bias with respect to substrate 11. Biasing noninverting terminal 32 negatively with respect to ground would provide such operation. Other output circuits, moreover, may be utilized with device 10, for example, the output circuit described and claimed in Garfinkel et al. U.S. Pat. No. 4,152,595, issued May 1, 1979 and assigned to the instant assignee.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A low capacitance radiation detector comprising:
   a monocrystalline semiconductor substrate doped to one type conductivity;
   a first semiconductor layer epitaxially grown on said substrate and doped to said one type conductivity, said first semiconductor layer being more lightly doped than substrate;
   a plurality of upper surface layer segments of said first semiconductor layer being doped to said one type conductivity more heavily than the remainder of said first semiconductor layer; and
   a patterned region of said first semiconductor layer being heavily doped to conductivity type opposite said one type conductivity, said patterned region taking the shape of substantially parallel stripes joined at each end thereof by a respective stripe perpendicular to said parallel stripes, each of said stripes extending from the upper surface of said first semiconductor layer further than said upper surface layer segments into said remainder of said first semiconductor layer and forming a minority charge carrier-collecting PN junction therewith, said patterned region being situated between adjacent ones of said upper surface layer segments and being separated therefrom;
   said first semiconductor layer exhibiting a predetermined minority charge carrier recombination diffusion length, said parallel stripes being spaced apart from each other by a distance smaller than or comparable to the minority charge carrier recombination diffusion length for said first semiconductor layer, and the thickness of said first semiconductor layer being smaller than or comparable to said minority charge carrier recombination diffusion length.

2. The low capacitance radiation detector of claim 1 including an electrically insulating, optically transparent layer on the upper surface of said first semiconductor layer, and a scintillator situated on said electrically insulating optically transparent layer such that light emitted by said scintillator in response to radiation impinging thereon passes through said electrically insulating optically transparent layer so as to be incident upon the upper surface of said first semiconductor layer.

3. The low capacitance radiation detector of claim 2 including a cathode terminal secured to said substrate and an anode terminal in contact with said patterned region.

4. The low capacitance radiation detector of claim 1 wherein said first semiconductor layer is in the range of 5–30 microns in thickness, said upper surface layer segments are ion implanted and substantially thinner than said first semiconductor layer, said substrate is substantially thicker than said first semiconductor layer, said patterned region is ion implanted, and the separation between said patterned region and the closest portion of any of said surface layer segments is in the range of 10–30 microns.

5. The low capacitance radiation detector of claim 1 wherein said first semiconductor layer is substantially 15 microns in thickness, said upper surface layer segments are ion implanted and at least an order of magnitude thinner than said first semiconductor layer, the thickness of said substrate is at least an order of magnitude thicker than said first semiconductor layer, said patterned region is ion implanted and the separation between said patterned region and the closest portion of any of said surface layer segments is substantially 30 microns.

6. The low capacitance radiation detector of claim 2 wherein said first semiconductor layer is substantially 15 microns in thickness, said upper surface layer segments are ion implanted and at least an order of magnitude thinner than said first semiconductor layer, said substrate is at least an order of magnitude thicker than said first semiconductor layer, said patterned region is ion implanted, and the separation between said patterned region and the closest portion of any of said surface layer segments is substantially 30 microns.

7. The low capacitance radiation detector of claim 6 wherein said semiconductor comprises silicon and said electrically insulating, optically transparent layer comprises silicon dioxide.

8. The low capacitance radiation detector of claim 7 wherein said electrically insulating, optically transparent silicon dioxide layer is substantially 0.1 microns thick.

9. The low capacitance radiation detector of claim 3 wherein said first semiconductor layer is substantially 15 microns in thickness, said upper surface layer segments are ion implanted and at least an order of magnitude thinner than said first semiconductor layer, said substrate is at least an order of magnitude thicker than said first semiconductor layer, said patterned region is ion implanted, and the separation between said patterned region and the closest portion of any of said surface layer segments is substantially 30 microns.

10. The low capacitance radiation detector of claim 9 wherein said semiconductor comprises silicon and said electrically insulating, optically transparent layer comprises silicon dioxide.

11. The low capacitance radiation detector of claim 10 wherein said electrically insulating, optically transparent silicon dioxide layer of is substantially 0.1 microns thick.

12. The low capacitance radiation detector of claim 3 further including a differential amplifier having an output terminal, an inverting input terminal and a noninverting input terminal, said inverting input terminal being coupled to said anode terminal and said noninverting input terminal being coupled to said cathode terminal, said low capacitance radiation detector further including a feedback capacitor coupled between said output terminal and said inverting input terminal.

13. The low capacitance radiation detector of claim 1 wherein said one type conductivity is N type and said conductivity type opposite said one conductivity type is P type.

14. The low capacitance radiation detector of claim 8 wherein said one type conductivity is N type and said conductivity type opposite said one conductivity type is P type.

15. The low capacitance radiation detector of claim 11 wherein said one type conductivity is N type and said conductivity type opposite said one conductivity type is P type.

16. The low capacitance radiation detector of claim 15 wherein said electrically insulating, optically transparent silicon dioxide layer is substantially 0.1 microns thick.

17. The low capacitance radiation detector of claim 14 wherein the substrate doping level is substantially $10^{16}$ atoms per cc, the first semiconductor layer doping level is substantially $10^{13}$ atoms per cc, the upper surface layer segments doping level is substantially $5 \times 10^{18}$ atoms per cc and the patterned region doping level is substantially $2 \times 10^{19}$ atoms per cc.

18. The low capacitance radiation detector of claim 15 wherein the substrate doping level is substantially $10^{16}$ atoms per cc, the first semiconductor layer doping level is substantially $10^{13}$ atoms per cc, the upper surface layer segments doping level is substantially $5 \times 10^{18}$ atoms per cc and the patterned region doping level is substantially $2 \times 10^{19}$ atoms per cc.

19. The low capacitance radiation detector of claim 1 wherein said first semiconductor layer has beveled edges and said upper surface layer segments of said first semiconductor layer extend over said beveled edges.

20. The low capacitance radiation detector of claim 2 wherein said first semiconductor layer has beveled edges and said upper surface layer segments of said first semiconductor layer extend over said beveled edges.

21. The low capacitance radiation detector of claim 3 wherein said first semiconductor layer has beveled edges and said upper surface layer segments of said first semiconductor layer extend over said beveled edges.

22. The low capacitance radiation detector of claim 4 wherein said first semiconductor layer has beveled edges and said upper surface layer segments of said first semiconductor layer extend over said beveled edges.

23. The low capacitance radiation detector of claim 13 wherein said first semiconductor layer has beveled edges and said upper surface layer segments of said first semiconductor layer extend over said beveled edges.

24. The low capacitance radiation detector of claim 21 further including a differential amplifier having an output terminal, an inverting input terminal and a noninverting input terminal, said inverting input terminal being coupled to said anode terminal and said noninverting input terminal being coupled to said cathode terminal, said low capacitance radiation detector further including a feedback capacitor coupled between said output terminal and said inverting input terminal.

* * * * *